United States Patent
Liu et al.

(10) Patent No.: US 9,403,673 B2
(45) Date of Patent: *Aug. 2, 2016

(54) METHOD FOR MANUFACTURING A MICROELECTROMECHANICAL SYSTEMS (MEMS) DEVICE WITH DIFFERENT ELECTRICAL POTENTIALS AND AN ETCH STOP

(71) Applicant: Taiwan Semiconductor Manufacturing Co., Ltd., Hsin-Chu (TW)

(72) Inventors: Yu-Chia Liu, Kaohsiung (TW); Chia-Hua Chu, Zhubei (TW); Kuei-Sung Chang, Kaohsiung (TW); Chun-Wen Cheng, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/880,375

(22) Filed: Oct. 12, 2015

(65) Prior Publication Data

US 2016/0031703 A1 Feb. 4, 2016

Related U.S. Application Data

(63) Continuation of application No. 14/450,505, filed on Aug. 4, 2014, now Pat. No. 9,221,674.

(51) Int. Cl.
*H01L 21/00* (2006.01)
*B81B 7/00* (2006.01)
*B81C 1/00* (2006.01)

(52) U.S. Cl.
CPC ............. *B81B 7/007* (2013.01); *B81C 1/00301* (2013.01); *B81B 2203/0163* (2013.01); *B81B 2203/0307* (2013.01); *B81B 2203/04* (2013.01); *B81C 2203/0118* (2013.01)

(58) Field of Classification Search
CPC .............. B81B 7/007; B81B 2203/004; B81C 1/00301

See application file for complete search history.

(56) References Cited

U.S. PATENT DOCUMENTS 8,900,905 B1    12/2014  Liu et al.
9,035,451 B2    5/2015   Liu et al.

OTHER PUBLICATIONS

Notice of Allowance dated Aug. 19, 2015 for U.S. Appl. No. 14/450,505.

*Primary Examiner* — Richard Booth
(74) *Attorney, Agent, or Firm* — Eschweiler & Associates, LLC (57) ABSTRACT

A semiconductor structure for a microelectromechanical systems (MEMS) device is provided. A first substrate region includes an electrical isolation layer arranged over a top surface of the first substrate region. A second substrate region is arranged over the electrical isolation layer and includes a MEMS device structure arranged within the second substrate region. The MEMS device structure includes a fixed mass and a proof mass. A dielectric region is arranged over the electrical isolation layer around the fixed mass. A fixed mass electrode is arranged around the dielectric region, and extends through the second substrate region to the electrical isolation layer. An isolated electrode extends through the second substrate region and the electrical isolation layer to the first substrate region on an opposite side of the proof mass as the fixed mass electrode. The method of forming the semiconductor structure is also provided.

20 Claims, 12 Drawing Sheets

METHOD FOR MANUFACTURING A MICROELECTROMECHANICAL SYSTEMS (MEMS) DEVICE WITH DIFFERENT ELECTRICAL POTENTIALS AND AN ETCH STOP

REFERENCE TO RELATED APPLICATION

This application is a Continuation of U.S. application Ser. No. 14/450,505, filed on Aug. 4, 2014, the contents of which are incorporated by reference in their entirety.

BACKGROUND

Microelectromechanical systems (MEMS) devices, such as accelerometers, pressure sensors, and gyroscopes, have found widespread use in many modern day electronic devices. For example, MEMS accelerometers are commonly found in automobiles (e.g., in airbag deployment systems), tablet computers, or in smart phones. For many applications, MEMS devices are electrically connected to application-specific integrated circuits (ASICs) to form complete MEMS systems. Commonly, the connections are formed by wire bonding, but other approaches are also possible.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. For example, "a first MEMS substrate" described in connection with FIG. 1A may not correspond to "a first substrate" described in connection with FIG. 3.

Modern day electronic devices are increasingly incorporating microelectromechanical systems (MEMS) devices, such as accelerometers or gyroscopes. The bulk manufacture of MEMS devices has been one of the key enabling technologies for the increasing use of MEMS devices within electronic devices. During the bulk manufacture of MEMS devices, a plurality of MEMS devices is formed within a MEMS wafer. Thereafter, a cap wafer having the same or a similar diameter as the MEMS wafer is arranged over and secured to the MEMS wafer. The combined MEMS and cap wafers are singulated or diced to form individual MEMS dies, each including at least one MEMS device.

Traditionally, to form MEMS devices within a MEMS wafer, a first substrate region and a second substrate region are provided. MEMS device structures corresponding to the MEMS devices are then formed in the second substrate region and the second substrate region is secured over the first substrate region. For a MEMS device which senses motion, the corresponding MEMS device structure includes a fixed mass and an anchor supporting a proof mass by a spring. After forming the MEMS device structures in the second wafer and securing the second wafer to the first wafer, regions of sacrificial layers surrounding the MEMS device structures are removed to allow movement within the MEMS device structures. These regions include regions surrounding proof masses and springs of the MEMS devices. Further, electrodes extending through the second wafer to the first wafer are formed to sense motion within the MEMS device structures.

One challenge with forming the MEMS devices as described above is that the electrodes are in electrical communication with the first substrate region. The first substrate region is typically silicon and, when initially formed, shorts the electrical potentials of two neighboring electrodes together. To remove these shorts prior to completion of device manufacture, additional post processing is needed to form isolation regions between neighboring electrodes with different electrical potentials. This adds additional cost and complexity to the manufacturing process. In addition, these initial shorts prevent wafer acceptance testing (WAT) with different electrical potentials prior to the additional post processing steps, which may hamper full characterization of the device and/or manufacturing process.

Another challenge with forming the MEMS devices as described above is that regions of the sacrificial layers surrounding fixed masses are eroded away while removing regions of the sacrificial layers surrounding proof masses and springs. Because the fixed mass regions of the sacrificial layers support the MEMS device structures, the erosion can lead to device failure, especially at smaller dimensions. This, in turn, can limit the size of the MEMS devices and prevent die shrinkage.

In view of the foregoing, the present disclosure is directed to an improved method of forming a MEMS device in which an electrical isolation layer is formed over a first substrate region. Neighboring electrodes with different electrical potentials are then electrically isolated from each other by arranging one of the neighboring electrodes through the electrical isolation layer and arranging the other neighboring electrode over the electrical isolation layer. This advantageously allows WAT with different electrical potentials and eliminates the need for additional post processing to separate different electrical potentials. Further, electrodes are formed around the fixed mass regions of the sacrificial layers so as to serve as etch stops during the removal of regions of the sacrificial layers surrounding springs and proof masses. This advantageously prevents erosion of the fixed mass regions of the sacrificial layers and allows the size of the MEMS devices to be reduced.

Figure 1A:
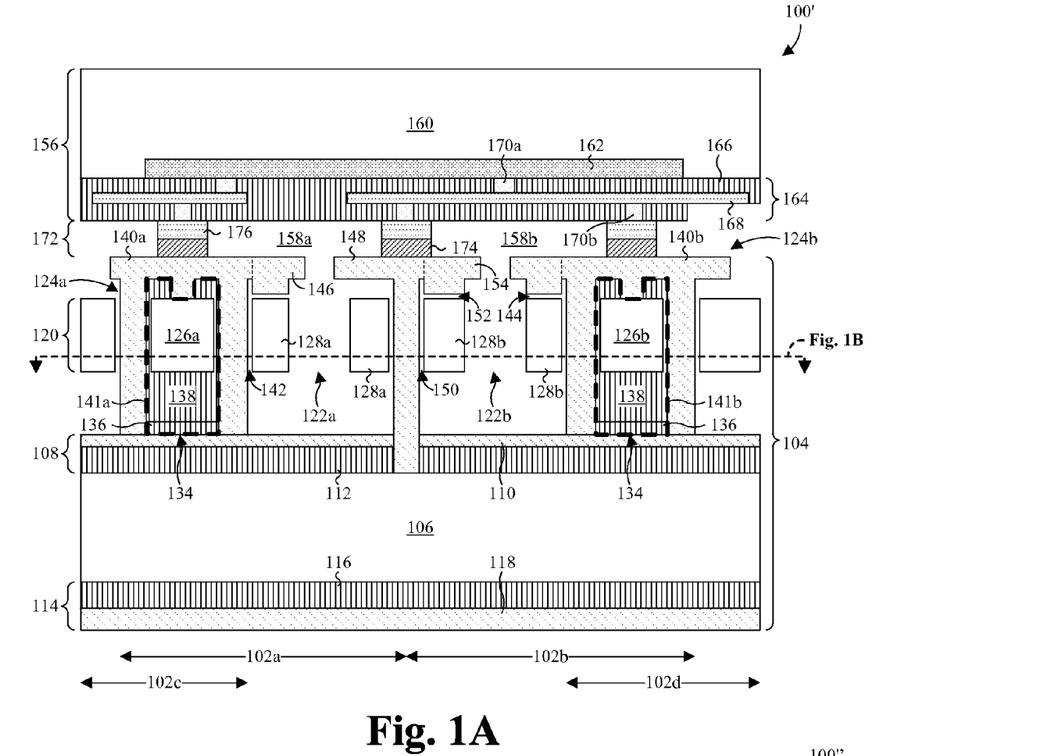
FIG. 1A illustrates a cross-sectional view of some embodiments of a semiconductor structure including first and second microelectromechanical systems (MEMS) devices with different electrical potentials electrically isolated by an electrical isolation layer and with fixed mass electrodes serving as etch stops.
Figure 1B:
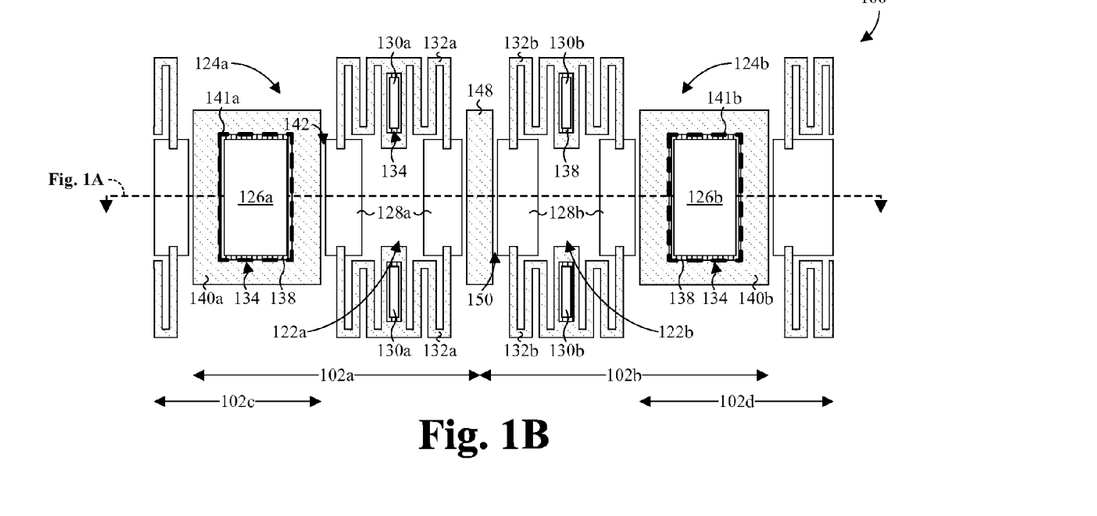
FIG. 1B illustrates a top view of some embodiments of the semiconductor structure of FIG. 1A.

With reference to FIGS. 1A & B, cross-sectional and top views 100', 100" are respectively illustrated for some embodiments of a semiconductor structure including a first MEMS device 102a and a second MEMS device 102b. The semiconductor structure also includes a third MEMS device 102c and a fourth MEMS device 102d, which are only partially illustrated. The MEMS devices 102 are, for example, motion sensors. The semiconductor structure can be part of a wafer-level structure (i.e., a structure spanning multiple dies) before or after singulation, or part of a die-level structure (i.e., a structure limited to a single die). Further, the semiconductor structure can include more or less MEMS devices 102.

A MEMS wafer (or structure) 104 of the semiconductor structure includes a first MEMS substrate region 106, such as a silicon wafer, and an electrical isolation structure 108 arranged over the first MEMS substrate region 106. The electrical isolation structure 108 typically abuts a top surface of the first MEMS substrate region 106 and includes an electrical isolation layer 110. In some embodiments, the electrical isolation structure 108 further includes or is otherwise associated with a base dielectric layer 112 over which the electrical isolation layer 110 is arranged. The electrical isolation structure 108 electrically isolates different electrical potentials of the MEMS devices 102 and prevents subsequently formed electrodes from shorting through the first MEMS substrate region 106. The base dielectric layer 112 is, for example, a thermal oxide, and the electrical isolation layer 110 is, for example, silicon nitride or silicon carbide.

In some embodiments, a residual structure 114 of the MEMS wafer 104 is arranged below the first MEMS substrate region 106. The residual structure 114 typically abuts a bottom surface of the first MEMS substrate region 106 and includes a residual dielectric layer 116 and a residual conductive layer 118 leftover from the manufacture of the MEMS devices 102. The residual dielectric layer 116 is, for example, a thermal oxide, and the residual conductive layer 118 is, for example, polysilicon.

A second MEMS substrate region 120 of the MEMS wafer 104 is arranged over and bonded with the first MEMS substrate region 106 through the electrical isolation structure 108. The second MEMS substrate region 120 is, for example, a silicon wafer or a portion of a silicon-on-isolator (SOI) wafer. Further, the second MEMS substrate region 120 includes a set of holes 122a, 122b, typically through holes, defining MEMS device structures 124a, 124b corresponding to the MEMS devices 102. Only some of the holes 122, and only MEMS device structures 124 for the first and second MEMS devices 102a, 102b, are specifically labeled. For each MEMS device 102 which senses motion, the corresponding MEMS device structure 124 includes a fixed mass 126a, 126b and a proof mass 128a, 128b attached to an anchor 130a, 130b by a spring 132a, 132b. The spring 132 advantageously allows the proof mass 128 to move relative to the anchor 130 and the fixed mass 126.

A MEMS bonding structure 134 of the MEMS wafer 104 includes a first MEMS bonding layer 136 and a second MEMS bonding layer 138. The first MEMS bonding layer 136 is arranged over the first MEMS substrate region 106 on the electrical isolation structure 108. The second MEMS bonding layer 138 is arranged on the second MEMS substrate region 120 around the fixed masses 126 and the anchors 130 of the MEMS device structures 124. The first and second MEMS bonding layers 136, 138 secure the second MEM substrate region 120 with the first MEMS substrate region 106 by a fusion bond at the interface between the two layers 136, 138. Further, the first and second MEMS bonding layers 136, 138 support the fixed masses 126 and the anchors 130 of the MEMS device structures 124. The first and second MEMS bonding layers 136, 138 are, for example, dielectric, such as oxide.

Fixed mass electrodes 140a, 140b correspond to the fixed masses 126 of the MEMS device structures 124, and are arranged around regions 141a, 141b of the MEMS bonding structure 134 that surround the corresponding fixed masses 126. The fixed mass electrode 140 of a MEMS bonding structure region 141 extends vertically down from above the MEMS bonding structure region 141, along opposing sidewalls of the MEMS bonding structure region 141, to the electrical isolation structure 108. Further, the fixed mass electrode 140 extends over a top surface of the MEMS bonding structure region 141 between the opposing sidewalls, and vertically down between the opposing sidewalls to electrically connect with the corresponding fixed mass 126.

The fixed mass electrodes 140 serve as sensing electrodes to sense in-plane motion (e.g., horizontal motion) and/or out-of-plane motion (e.g., vertical motion) within corresponding MEMS device structures 124. For sensing in-plane motion, the fixed mass electrodes 140 are associated with fixed mass in-plane sensing gaps 142. The fixed mass in-plane sensing gaps 142 facilitate the detection of in-plane motion, and are arranged between sidewalls of corresponding fixed masses electrodes 140 and corresponding proof masses 128. For sensing out-of-plane motion, the fixed mass electrodes 140 are associated with fixed mass out-of-plane sensing gaps 144 and include corresponding fixed mass out-of-plane sensing regions 146 extending laterally over the proof masses 128. The fixed mass out-of-plane sensing gaps 144 facilitate the detection of out-plane motion, and are arranged between top and bottom surfaces of corresponding proof masses 128 and corresponding fixed mass out-of-plane sensing regions 146. For readability, only a single fixed mass in-plane sensing gap 142, a single fixed mass out-of-plane sensing gap 144, and a single fixed mass out-of-plane sensing region 146 are specifically labeled.

The fixed mass electrodes 140 also serve as etch stops to protect the MEMS bonding structure 134 during the manufacture of the MEMS devices 102. As described in greater detail hereafter, the first and second MEMS bonding layers 136, 138 are formed as part of sacrificial layers surrounding the MEMS device structures 124. During the manufacture of the MEMS devices 102, an etch is performed into the sacrificial layers to remove those regions surrounding the proof masses 128 and the springs 132. The remaining regions of the sacrificial layers correspond to the first and second MEMS bonding layers 136, 138. Without the fixed mass electrodes 140 protecting the regions 141 of the sacrificial layers surrounding the fixed masses 126, the etch would erode the fixed mass regions 141 of the sacrificial layers. This could, in turn, cause structural failure of the MEMS devices 102 because the fixed mass regions 141 of the sacrificial layers support the fixed masses 126 and the MEMS device structures 124.

An isolated electrode 148 is arranged between the fixed mass electrodes 140 and extends vertically down from about even with top surfaces of the fixed mass electrodes 140 to the first MEMS substrate region 106 through the electrical isolation structure 108. In some embodiments, the isolated electrode 148 further extends laterally over adjacent proof masses 128. By arranging the isolated electrode 148 so it extends through the electrical isolation structure 108, different electrical potentials at the isolated and fixed mass electrodes 140, 148 are not shorted by the first MEMS substrate region 106. Therefore, WAT can be performed with different electrical potentials to ensure proper operation of the MEMS devices 102 and additional post processing is unnecessary to form electrical isolation regions.

The isolated electrode 148 serves as a sensing electrode to sense in-plane motion and/or out-of-plane motion within a corresponding MEMS device structure 124. For sensing in-plane motion, the isolated electrode 148 is associated with isolated in-plane sensing gaps 150. The isolated in-plane sensing gaps 150 are arranged between sidewalls of the isolated electrode 148 and corresponding proof masses 128. For sensing out-of-plane motion, the isolated electrode 148 is associated with isolated out-of-plane sensing gaps 152 and includes corresponding isolated out-of-plane sensing regions 154 extending laterally over the proof masses 128. The isolated out-of-plane sensing gaps 152 facilitate the detection of out-plane motion, and are arranged between top and bottom surfaces of corresponding proof masses 128 and corresponding isolated out-of-plane sensing regions 154. For readability, only a single fixed mass isolated in-plane sensing gap 150, a single isolated out-of-plane sensing gap 152, and a single isolated out-of-plane sensing region 154 are illustrated.

A cap wafer (or structure) 156 of the semiconductor structure is arranged over and bonded to the MEMS wafer 104 to define chambers 158a, 158b over and abutting corresponding MEMS devices 102. The chambers 158 are defined between the cap wafer 156 and the MEMS wafer 104. In some embodiments, the chambers 158 include a chamber 158 for each MEMS device 102 and/or wholly or substantially cover the corresponding MEMS devices 102. Further, in some embodiments, the cap wafer 156 is a complementary metal-oxide-semiconductor (CMOS) wafer. The CMOS wafer 156 includes a CMOS substrate region 160 and CMOS devices 162 (e.g., transistors) formed at a bottom surface of the CMOS substrate region 160. The CMOS substrate region 160 is, for example, silicon and/or is, for example, a wafer. The CMOS wafer 156 further includes an interconnect structure 164 arranged over the bottom surface of the CMOS substrate region 160. The interconnect structure 164 includes an interconnect dielectric layer 166 surrounding conductive lines 168 and vias 170a, 170b electrically coupling the CMOS devices 162 to the MEMS wafer 104. For readability, only some of the conductive lines 168 and some of the vias 170 are specifically labeled. The interconnect dielectric layer 166 is, for example, an oxide or low-k dielectric, the conductive lines 168 and the vias 170 are, for example, copper.

A cap bonding structure 172 is arranged outside of the chambers 158 between the MEMS and cap wafers 104, 156 and bonds the MEMS wafer 104 to the cap wafer 156. The cap bonding structure 172 includes a first cap bonding layer 174 arranged on the MEMS wafer 104, and a second cap bonding layer 176 arranged on the cap wafer 156. A eutectic bond at the interface between the first and second cap bonding layers 174, 176 bonds the layers 174, 176 together. This, in turn, bonds the MEMS wafer 104 and the cap wafer 156 together. The first cap bonding layer 174 is, for example, comprised of aluminum copper, and the second cap bonding layer 176 is, for example, comprised of germanium.

In view of the foregoing discussion, neighboring electrodes with different electrical potentials can be separated by an electrical isolation structure comprising at least an electrical isolation layer. One of the neighboring electrodes is arranged over the electrical isolation structure and the other neighboring electrode is arranged through the electrical isolation structure. For example, in FIG. 1A, fixed mass electrodes 140 are arranged over electrical isolation structure 108 and neighboring isolated electrode 148 is arranged through the electrical isolation structure 108. The electrical isolation structure prevents shorting between the neighboring electrodes and allows different electrical potentials within a MEMS wafer to be separated. This, in turn, allows WAT with different electrical potentials and eliminates the need for costly and/or complex post processing operations to separate different electrical potentials.

Also, in view of the foregoing discussion, fixed mass electrodes of a MEMS wafer can be formed to act as etch stops for fixed mass regions of sacrificial layers formed during the manufacture the MEMS devices. This allows the fixed mass regions to maintain structural integrity when portions of the sacrificial layers surrounding movable regions of the MEMS devices are released or removed. Further, this allows the MEMS devices to be reduced in size since margins are not needed around the fixed mass regions of the sacrificial layers to ensure structural integrity.

Figure 2:
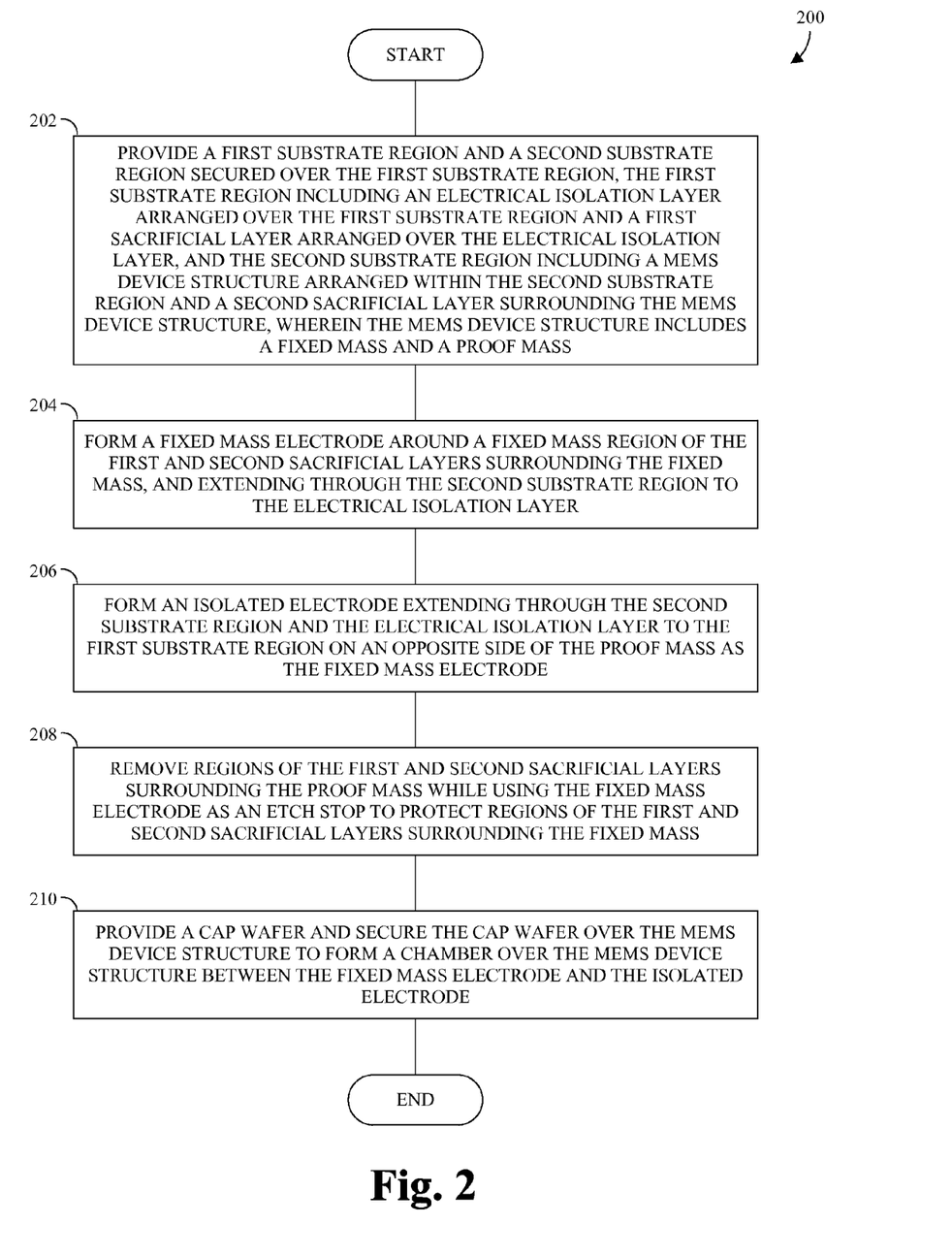
FIG. 2 illustrates a flow chart of some embodiments of a method of manufacturing a semiconductor structure including first and second MEMS devices with different electrical potentials electrically isolated by an electrical isolation layer and with fixed mass electrodes serving as etch stops.

With reference to FIG. 2, a flow chart 200 provides some embodiments of a method for manufacturing a semiconductor structure including first and second MEMS devices with different electrical potentials electrically isolated by an electrical isolation layer and with fixed mass electrodes serving as etch stops. An example of the completed semiconductor structure is shown in FIGS. 1A & B.

According to the method, a first substrate region and a second substrate region secured over the first substrate region are provided (Action 202). The first substrate region includes an electrical isolation layer arranged over the first substrate region and a first sacrificial layer arranged over the electrical isolation layer. The second substrate region includes a MEMS device structure arranged within the second substrate region and a second sacrificial layer surrounding the MEMS device structure. The MEMS device structure includes a fixed mass and a proof mass.

A fixed mass electrode is formed (Action 204) around a fixed mass region of the first and second sacrificial layers surrounding the fixed mass, and extending through the second substrate region to the electrical isolation layer.

An isolated electrode extending through the second substrate region and the electrical isolation layer to the first substrate region is formed (Action 206) on an opposite side of the proof mass as the fixed mass electrode. The fixed mass electrode and the isolated electrode are, in some embodiments, formed concurrently.

Regions of the first and second sacrificial layer surrounding the proof mass are removed (Action 208) while using the fixed mass electrode as an etch stop to protect regions of the first and second sacrificial layers surrounding the fixed mass. Such a removal is possible because the fixed mass electrode surrounds the fixed mass regions of the first and second sacrificial layers. Advantageously, by protecting the regions of the first and second sacrificial layers surrounding the fixed mass, the size of the MEMS device structure can be reduced. Namely, the fixed mass regions of the sacrificial layer are not eroded during the removal, whereby margins aren't required to ensure structural integrity.

A cap wafer is provided and secured (Action 212) over the MEMS device structure to form a chamber over the MEMS device structure between the fixed mass electrode and the isolated electrode.

While the disclosed methods (e.g., the method described by the flowchart 200) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

With reference to FIGS. 3-21, cross-sectional views of some embodiments of a semiconductor structure at various stages of manufacture are provided to illustrate the method. The semiconductor structure includes first and second MEMS devices with different electrical potentials electrically isolated by an electrical isolation layer and with fixed mass electrodes serving as etch stops. Although FIGS. 3-21 are described in relation to the method, it will be appreciated that the structures disclosed in FIGS. 3-21 are not limited to the method, but instead may stand alone as structures independent of the method. Similarly, although the method is described in relation to FIGS. 3-21, it will be appreciated that the method is not limited to the structures disclosed in FIGS. 3-21, but instead may stand alone independent of the structures disclosed in FIGS. 3-21.

FIGS. 3-12 illustrate cross-sectional views 300-800 of some embodiments corresponding to Action 202.

Figure 3:
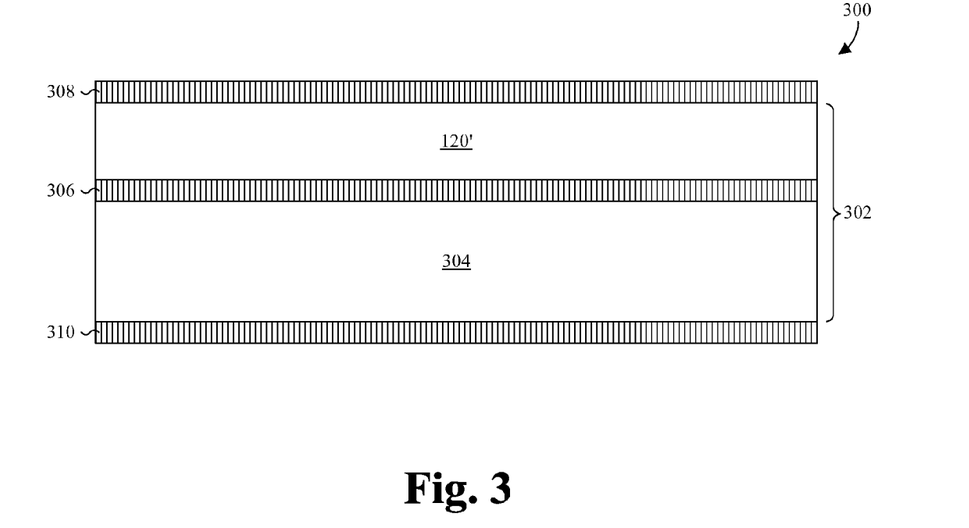
FIGS. 3-21 illustrate a series of cross-sectional views of some embodiments of a semiconductor structure at various stages of manufacture, the semiconductor structure including first and second MEMS devices with different electrical potentials electrically isolated by an electrical isolation layer and with fixed mass electrodes serving as etch stops.

As shown by FIG. 3, a first, SOI wafer 302 is provided. The SOI wafer 302 includes a first substrate region 304, a second substrate region 120' arranged over the first substrate region 304, and a first dielectric layer 306 arranged between a top surface of the first substrate region 304 and a bottom surface of the second substrate region 120'. The first substrate region 304 is sacrificial and is, for example, silicon. The second substrate region 120' is, for example, silicon and/or is, for example, about 30-40 micrometers thick. The first dielectric layer 306 is sacrificial and is, for example, an oxide, such as silicon dioxide.

Also shown by FIG. 3, a second dielectric layer 308 is formed over a top surface of the SOI wafer 302 and a third dielectric layer 310 is formed over a bottom surface of the SOI wafer 302. The second and third dielectric layers 308, 310 are sacrificial layers. Further, the second and third dielectric layers 308, 310 are typically formed by a common deposition and/or are typically an oxide.

Figure 4:
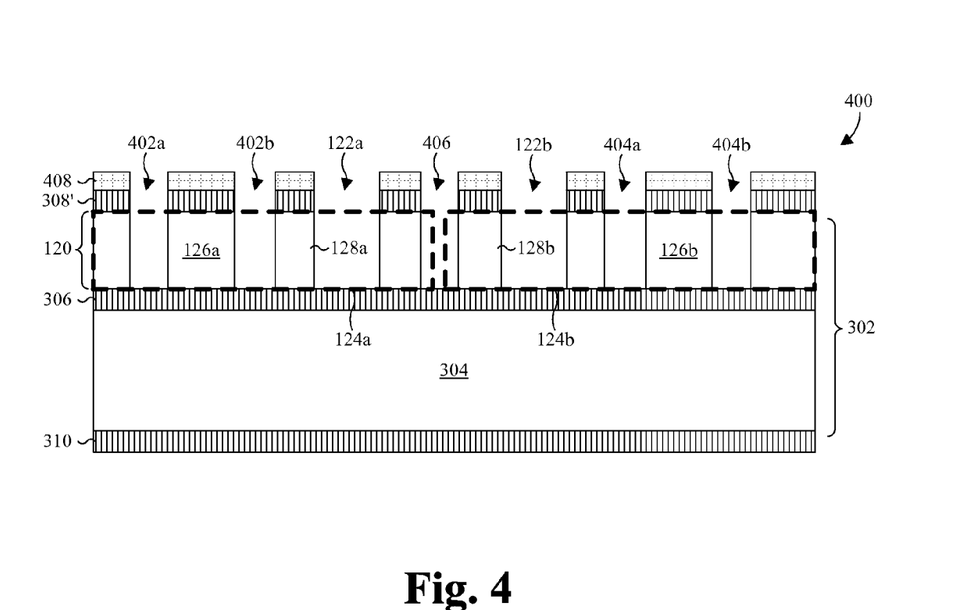

As shown by FIG. 4, a first etch is performed through select portions of the second dielectric layer 308 and the second substrate region 120' to form a set of holes 122, 402-406 defining MEMS device structures 124a, 124b. The MEMS device structures 124 correspond to MEMS device sensing motion and each include a fixed mass 126a, 126b and a proof mass 128a, 128b attached to an anchor by a spring.

The set of holes 122, 402-406 are typically through holes and include first pairs of fixed mass side holes 402a, 402b, 404a, 404b corresponding to the MEMS device structures 124. The fixed mass side holes 402, 404 of each pair are arranged on opposing sides of the fixed mass 126 of the corresponding MEMS device structure 124. The set of holes 122, 402-406 further include a first electrical isolation hole 406 and spacing holes 122a, 122b corresponding to the MEMS device structures 124. The first electrical isolation hole 406 is arranged between the first pairs of fixed mass side holes 402, 404, and the proof masses 128 are arranged between the first electrical isolation hole 406 and the corresponding first pairs of fixed mass side holes 402, 404. The spacing holes 122 provide spacing between different substructures of the proof masses 128.

In some embodiments, the first etch includes forming a first photoresist layer over a top surface of the second dielectric layer 308. The first photoresist layer is then pattern in accordance with the MEMS device structures 124. Further, an etchant is applied the patterned first photoresist layer 408 to form the set of holes 122, 402-406.

Figure 5:
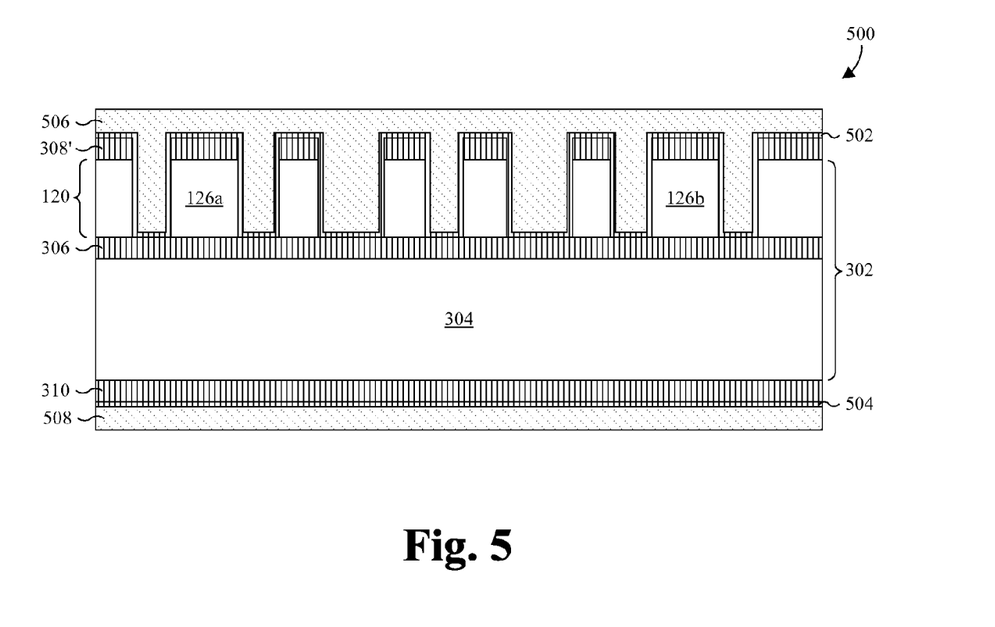

As shown by FIG. 5, a fourth dielectric layer 502 is formed over a top surface of the remaining second dielectric layer 308', and along sidewalls of the remaining second substrate region 120 and the remaining second dielectric layer 308'. Further, a fifth dielectric layer 504 is formed over the third dielectric layer 310. The fourth and fifth dielectric layers 502, 504 are sacrificial and, in some embodiments, about 50 nanometers to about one micrometer thick. Further, fourth and fifth dielectric layers 502, 504 are, for example, oxide formed by thermal oxidation. The formation of the fourth dielectric layer 502 helps define in-plane sensing gaps.

Also shown by FIG. 5, a first conductive layer 506 is formed over the fourth dielectric layer 502 to fill the set of holes 122, 402-406. Further, a second conductive layer 508 is formed over the fifth dielectric layer 504. The first and second conductive layers 506, 508 are, for example, polysilicon.

Figure 6:
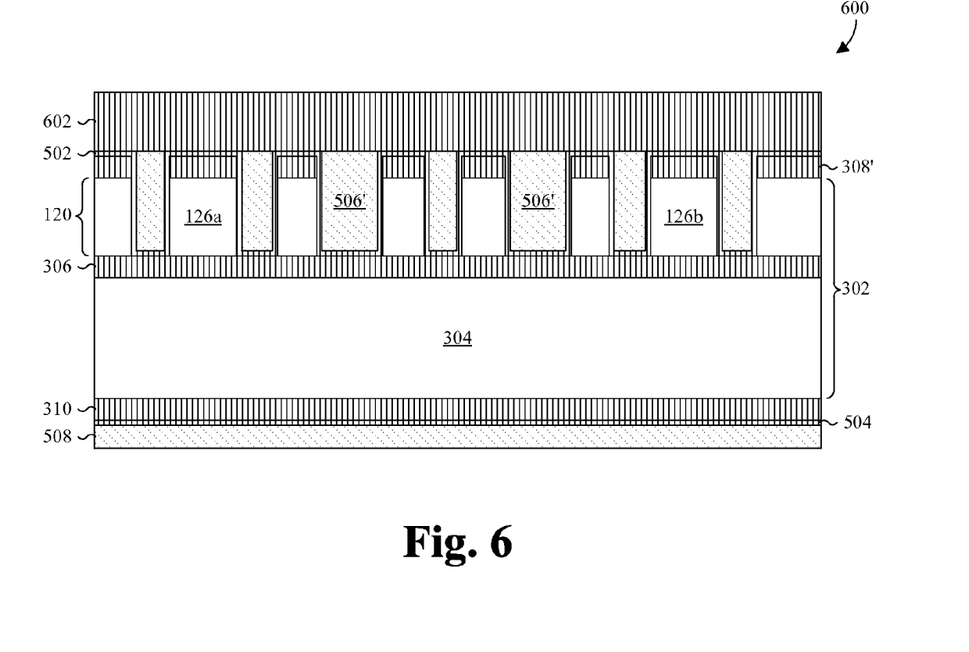

As shown by FIG. 6, a first planarization and/or etch back is performed into the first conductive layer 506 to a top surface of the fourth dielectric layer 502. The first planarization can be performed by, for example, a chemical mechanical polish (CMP). Further, a sixth dielectric layer 602 is formed over the fourth dielectric layer 502 and the remaining first conductive layer 506'. The sixth dielectric layer 602 is sacrificial and, for example, an oxide.

Figure 7:
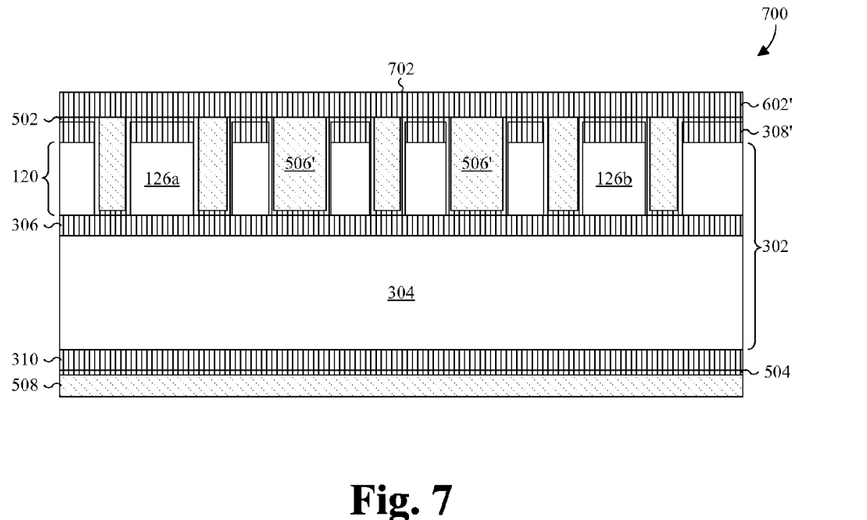

As shown by FIG. 7, a second planarization and/or etch back is performed into the sixth dielectric layer 602 to define a first bond interface 702.

Figure 8:
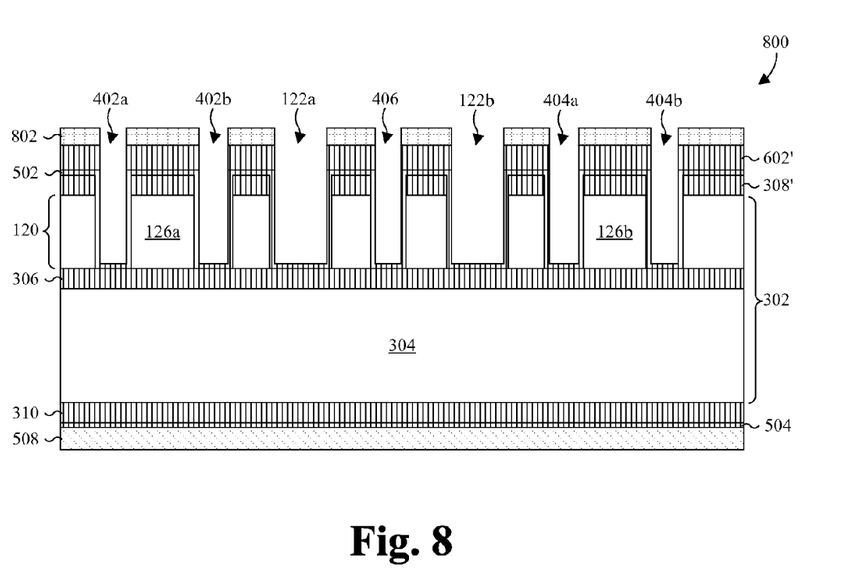

As shown by FIG. 8, a second etch is performed through select portions of the remaining sixth dielectric layer 602' and through the remaining first conductive layer 506' to remove the remaining first conductive layer 506' and to expose the set of holes 122, 402-406. In some embodiments, the second etch includes forming a second photoresist layer over top surfaces of the remaining first conductive layer 506' and the remaining sixth dielectric layer 602', patterning the second photoresist layer, and applying an etchant over the second patterned photoresist layer 802.

Figure 9:
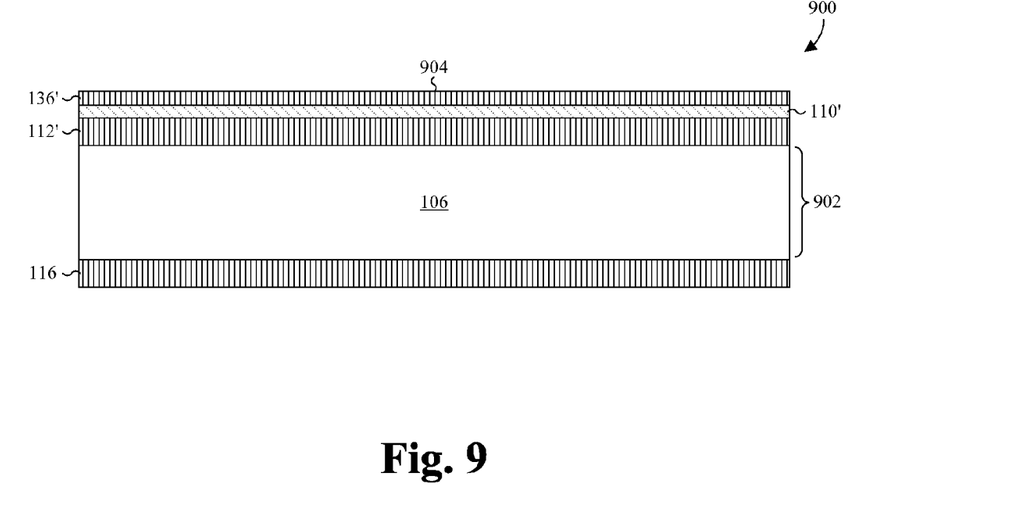

As shown by FIG. 9, a second wafer 902 including a third substrate region 106 is provided. The second wafer 902 typically has the same or a similar size as the first wafer 302. The third substrate region 106 is, for example, silicon.

Also shown by FIG. 9, a seventh dielectric layer 112' and an eighth dielectric layer 116 are formed respectively over the top and bottom surfaces of the third substrate region 106. Further, an electrical isolation layer 110' is formed over the seventh dielectric layer 112', and a ninth dielectric layer 136' is formed over the electrical isolation layer 110'. The seventh, eighth and ninth dielectric layers 112', 116, 136' are, for example oxides. The seventh and eighth dielectric layers 112', 116 are, for example, formed by thermal oxidation. The ninth dielectric layer 136' defines a second bond interface 904 and is sacrificial. The electrical isolation layer 110' is, for example, silicon nitride or silicon carbide.

Figure 10:
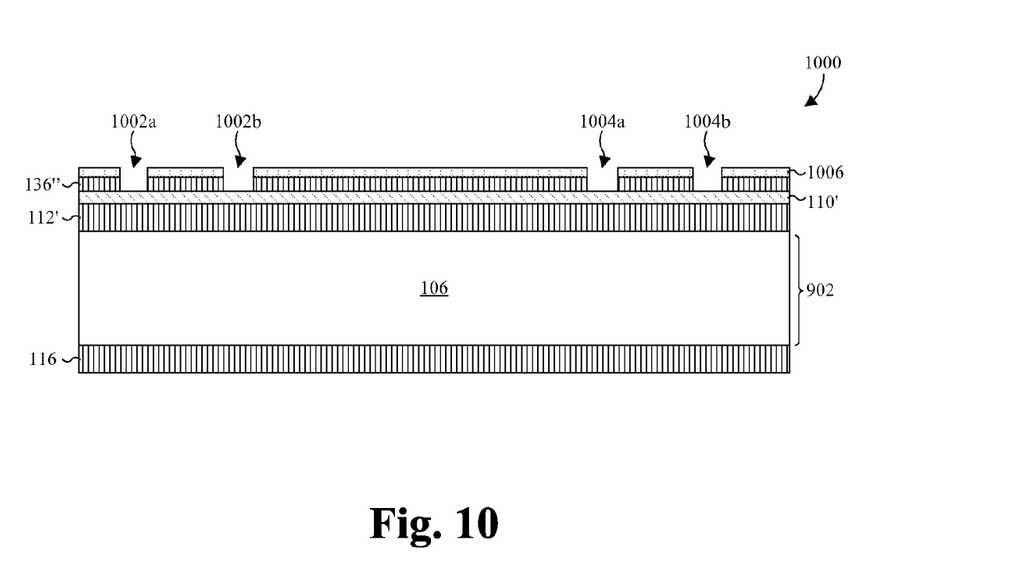

As shown by FIG. 10, a third etch is performed through the ninth dielectric layer 136' to form one or more second pairs of fixed mass side holes 1002a, 1002b, 1004a, 1004b corresponding to the first pairs of fixed mass side holes 402, 404. In some embodiments, the third etch includes forming a third photoresist layer over a top surface of the ninth dielectric layer 136', patterning the third photoresist layer, and applying an etchant over the third patterned photoresist layer 1006.

Figure 11:
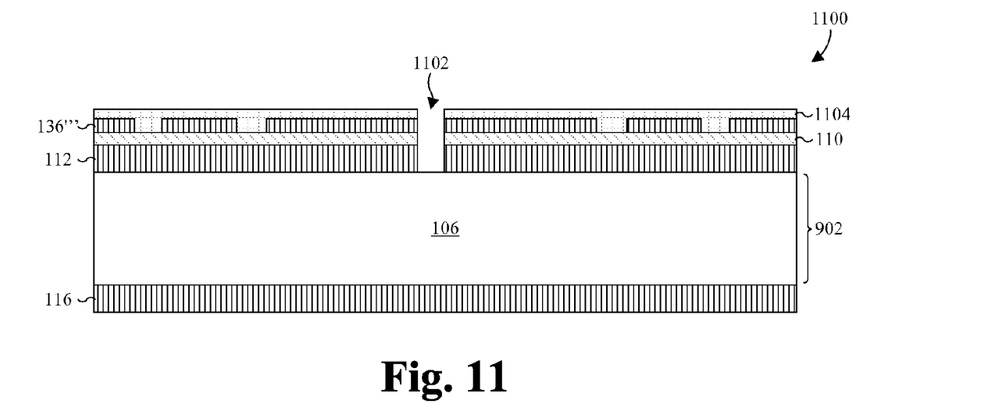

As shown by FIG. 11, a fourth etch is performed through the remaining ninth dielectric layer 136", the electrical isolation layer 110', and the seventh dielectric layer 112' to form a second electrical isolation hole 1102 corresponding to the first electrical isolation hole 406. In some embodiments, the fourth etch includes forming a fourth photoresist layer over a top surface of the remaining ninth dielectric layer 136", patterning the fourth photoresist layer, and applying an etchant over the patterned fourth photoresist layer 1104.

Figure 12:
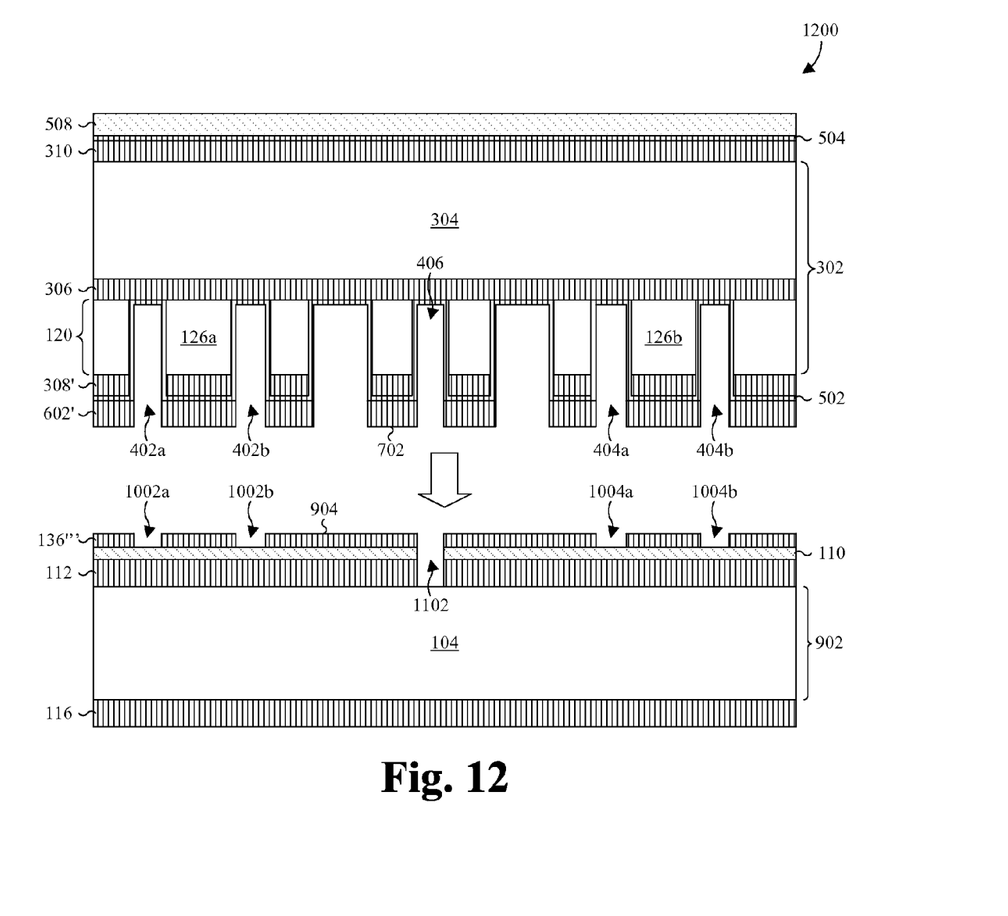

As shown by FIG. 12, the semiconductor structure of the first wafer 302 is secured to the semiconductor structure of the second wafer 902 along the first and second bond interfaces 702, 904 so the first pairs of fixed mass side holes 402, 404 align with corresponding second pairs of fixed mass side holes 1002, 1004 and the first electrical isolation hole 406 aligns with the corresponding second electrical isolation hole 1102. The first and second semiconductor structures are typically bonded using fusion bonding with, for example, an oxide-oxide fusion bond.

FIGS. 13-18 illustrate cross-sectional views 1300-1800 of some embodiments corresponding to Actions 204 and 206.

Figure 13:
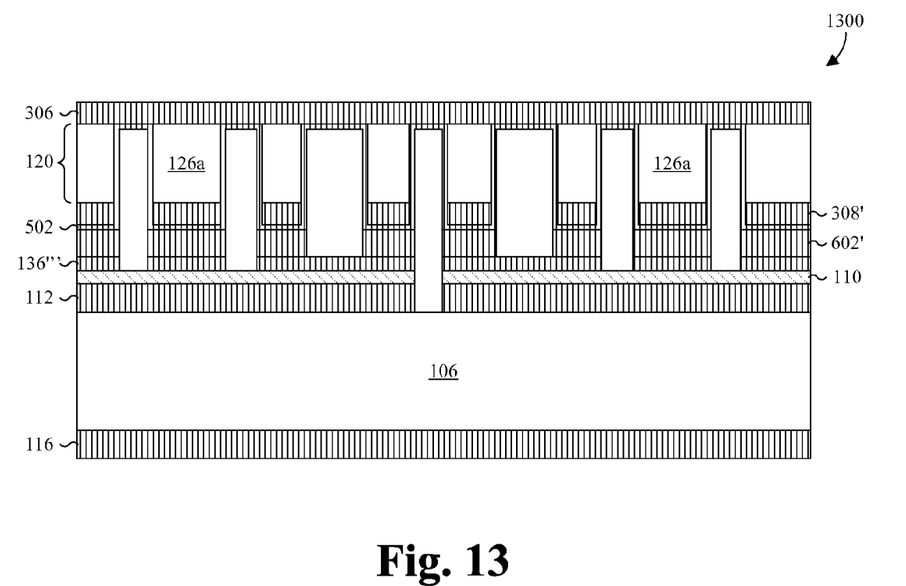

As shown by FIG. 13, a third planarization and/or etch back is performed through the second conductive layer 508, the fifth dielectric layer 504, the third dielectric layer 310, and the first substrate region 304 to the first dielectric layer 306. In some embodiments, a planarization is performed through the second conductive layer 508, the fifth dielectric layer 504, the third dielectric layer 310, and into the first substrate region 304, and an etch back is performed through the remaining first substrate region to the first dielectric layer 306. The planarization is, for example, performed by a CMP.

Figure 14:
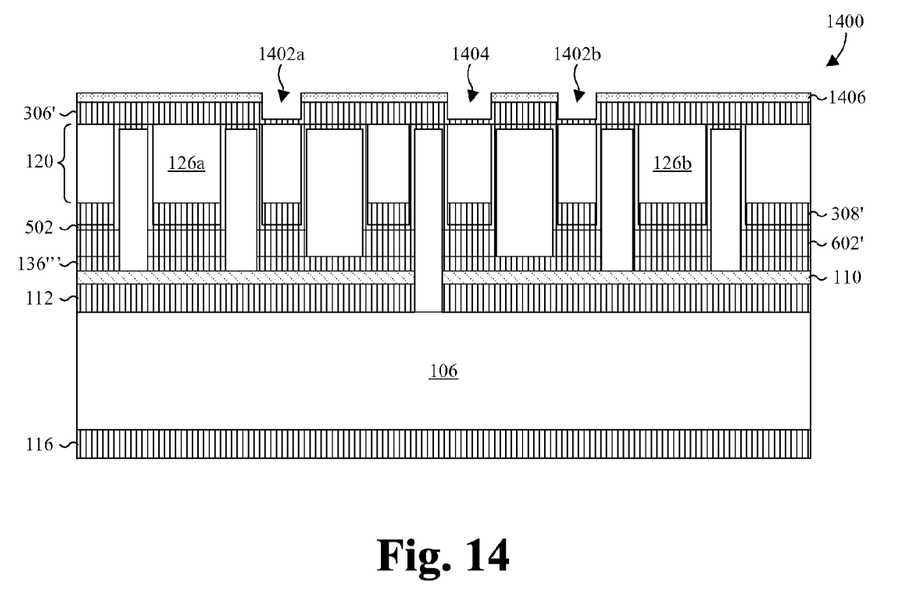

As shown by FIG. 14, a fifth etch is performed into the first dielectric layer 306 to define out-of-plane sensing gap holes 1402a, 1402b, 1404. The formation of the out-of-plane sensing gap holes 1402, 1404 helps define the out-of-plane sensing gaps discussed above. In some embodiments, the fifth etch includes forming a fifth photoresist layer over a top surface of the first dielectric layer 306, patterning the fifth photoresist layer, and applying an etchant over the patterned fifth photoresist layer 1406.

Figure 15:
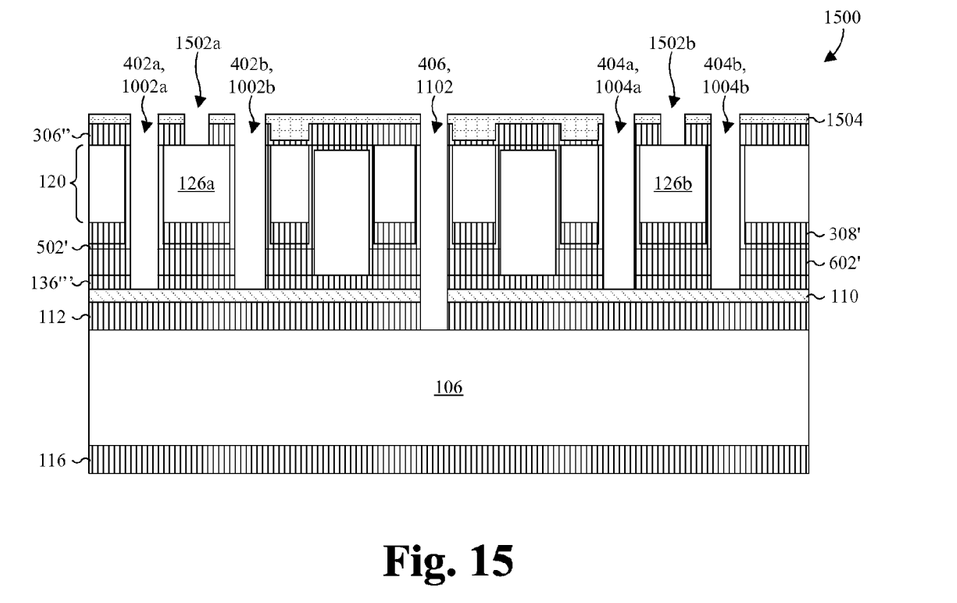

As shown by FIG. 15, a sixth etch is performed through select portions of the remaining first dielectric layer 306' and the fourth dielectric layer 502 to expose the first and second pairs of fixed mass side holes 402, 404, 1002, 1004 and the first and second electrical isolation holes 406, 1102. Further, the sixth etch forms fixed mass top holes 1502a, 1502b exposing the fixed masses 126. In some embodiments, the sixth etch includes forming a sixth photoresist layer over top surfaces of the remaining first dielectric layer 306' and the fourth dielectric layer 502, patterning the sixth photoresist layer, and applying an etchant over the patterned sixth photoresist layer 1504.

Figure 16:
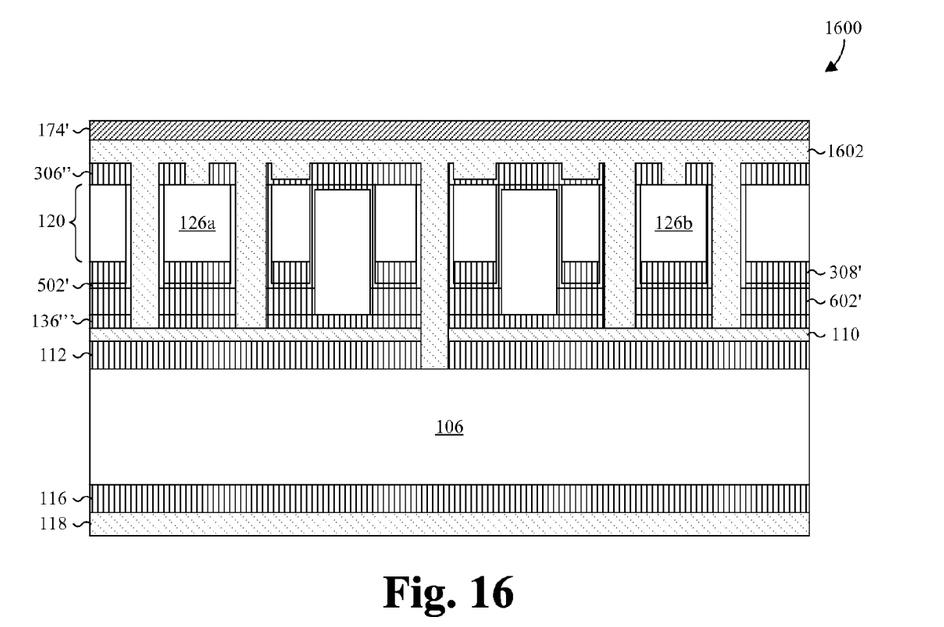

As shown by FIG. 16, a third conductive layer 1602 is formed over a top surface of the remaining first dielectric layer 306" and filling the first and second pairs of fixed mass side holes 402, 404, 1002, 1004, the first and second electrical isolation holes 406, 1102, and the fixed mass top holes 1502. Further, a fourth conductive layer 118 is formed over a bottom surface of the eighth dielectric layer 116, and a fifth conductive layer 174' is formed over the third conductive layer 1602. The third and fourth conductive layers 118, 1602 are typically formed as part of the same deposition and/or are, for example, polysilicon. The fifth conductive layer 174' is typically a metal, such as, for example, aluminum copper.

Figure 17:
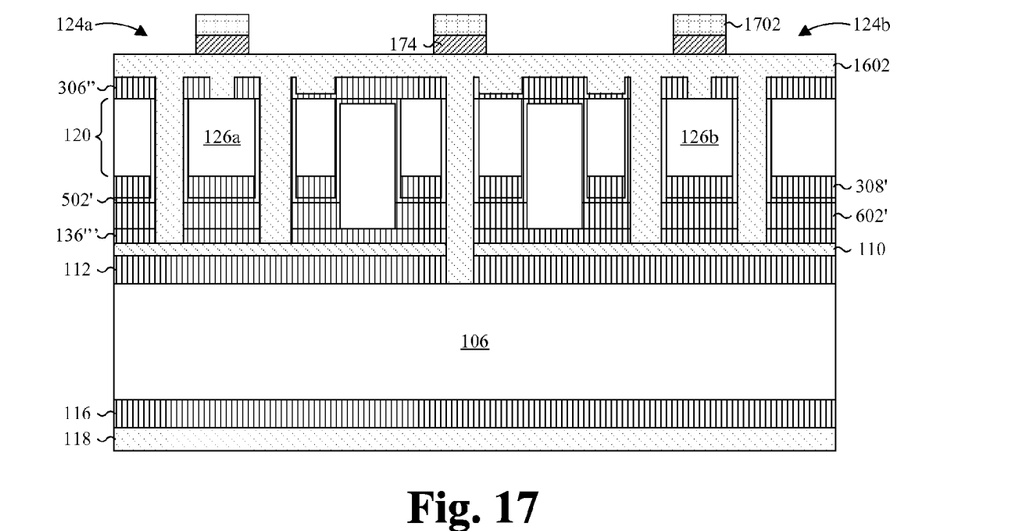

As shown by FIG. 17, a seventh etch is performed through select portions of the fifth conductive layer 174' to form a first cap bonding layer 174 around the periphery of the MEMS device structures 124 and over the fixed masses 126 of the MEMS device structures 124. In some embodiments, the seventh etch includes forming a seventh photoresist layer over a top surface of the fifth conductive layer 174', patterning the seventh photoresist layer, and applying an etchant over the patterned seventh photoresist layer 1702.

Figure 18:
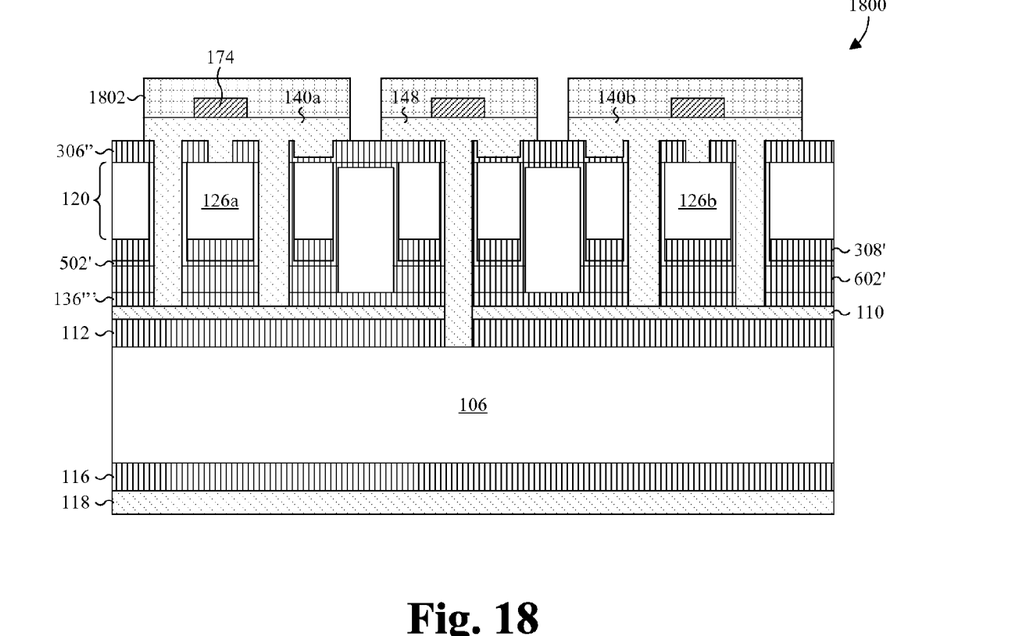

As shown by FIG. 18, an eighth etch is performed through select portions of the third conductive layer 1602 to form fixed mass electrodes 140a, 140b corresponding to the fixed masses 126 and to form an isolated electrode 148 arranged between the fixed mass electrodes 140. The fixed mass electrodes 140 fill corresponding first and second pairs of fixed mass side holes 402, 404, 1002, 1004, and corresponding fixed mass top holes 1502, and the isolated electrode 148 fills the first and second electrical isolation holes 406, 1102. As such, the fixed mass electrodes 140 extend vertically down to the remaining electrical isolation layer 110, and the isolation electrode 148 extends vertically down through the remaining electrical isolation layer 110 to the third substrate region 106. This advantageously allows different electrical potentials at the fixed mass electrodes 140 and the isolation electrode 148, which, in turn, allows WAT with different electrical potentials. WAT can be performed using different regions of the first cap bonding layer 174 as testing pads. In some embodiments, the eighth etch includes forming an eighth photoresist layer over a top surface of the third conductive layer 1602, patterning the eighth photoresist layer, and applying an etchant over the patterned eighth photoresist layer 1802.

Figure 19:
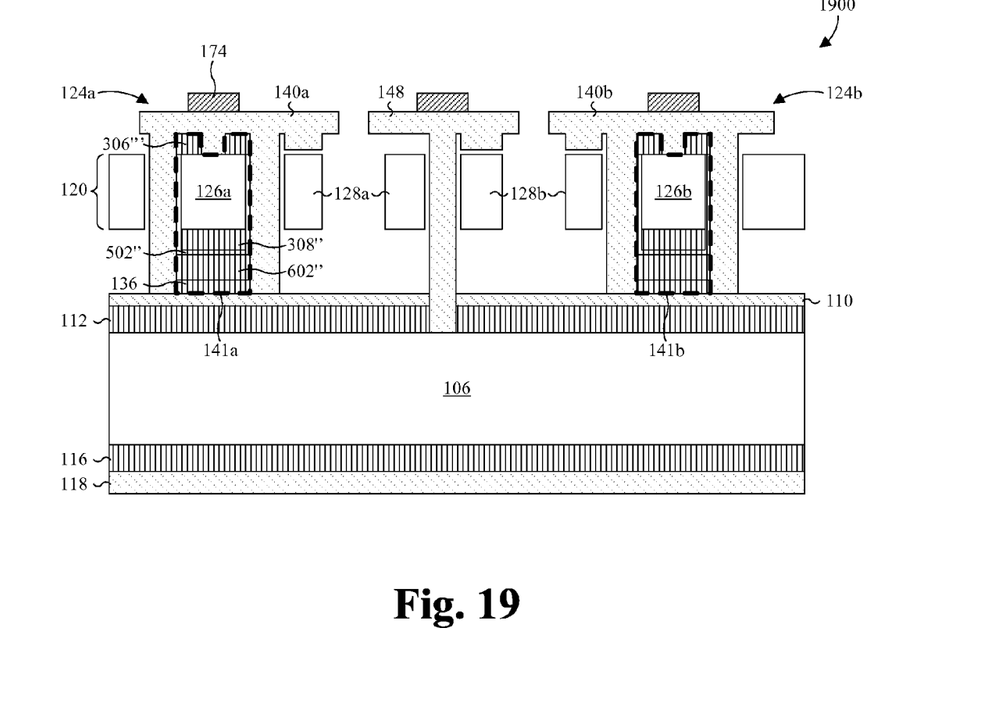

FIG. 19 illustrates a cross-sectional view 1900 of some embodiments corresponding to Action 208. As shown by FIG. 19, a ninth etch—sometimes referred to as a "release etch"—is performed through select portions of the remaining ninth dielectric layer 136''', the remaining fourth dielectric layer 502', the remaining first dielectric layer 306", the remaining sixth dielectric layer 602', and the remaining second dielectric layer 308' (collectively the "sacrificial layers") to allow the proof masses 128 to move. Advantageously, the fixed mass electrodes 140 are arranged around regions 141a, 141b of the sacrificial layers 134''', 502', 306", 602', 308' surrounding and supporting the fixed mass 126. The fixed mass electrodes 140 therefore act as etch stops to protect the fixed mass regions 141 of the sacrificial layers 134''', 502', 306", 602', 308' during the ninth etch. This prevents damage to the fixed mass regions 141 and allows MEMS devices structures 124 to be reduced in size since the etch is more accurate and does not require margins around the fixed mass regions 141.

Figure 20:
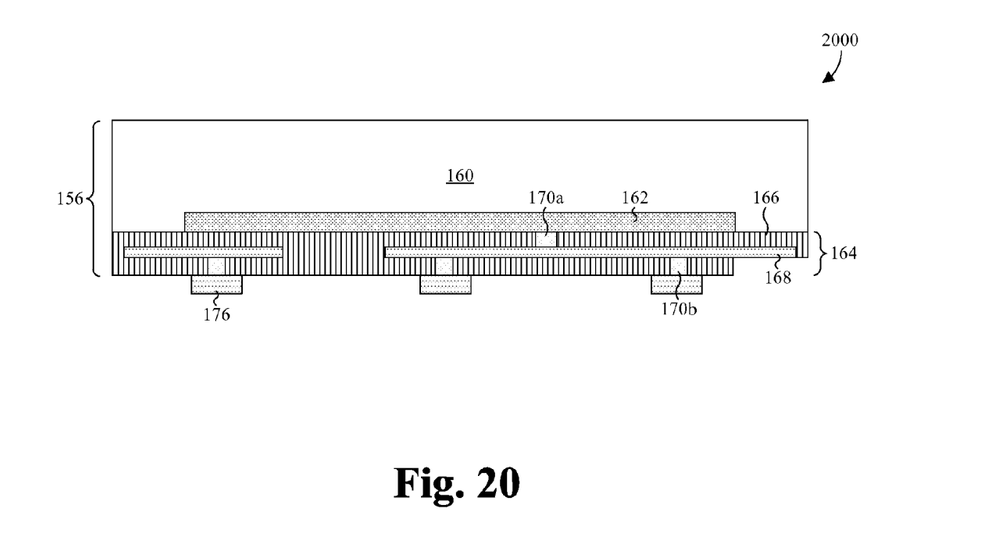
Figure 21:
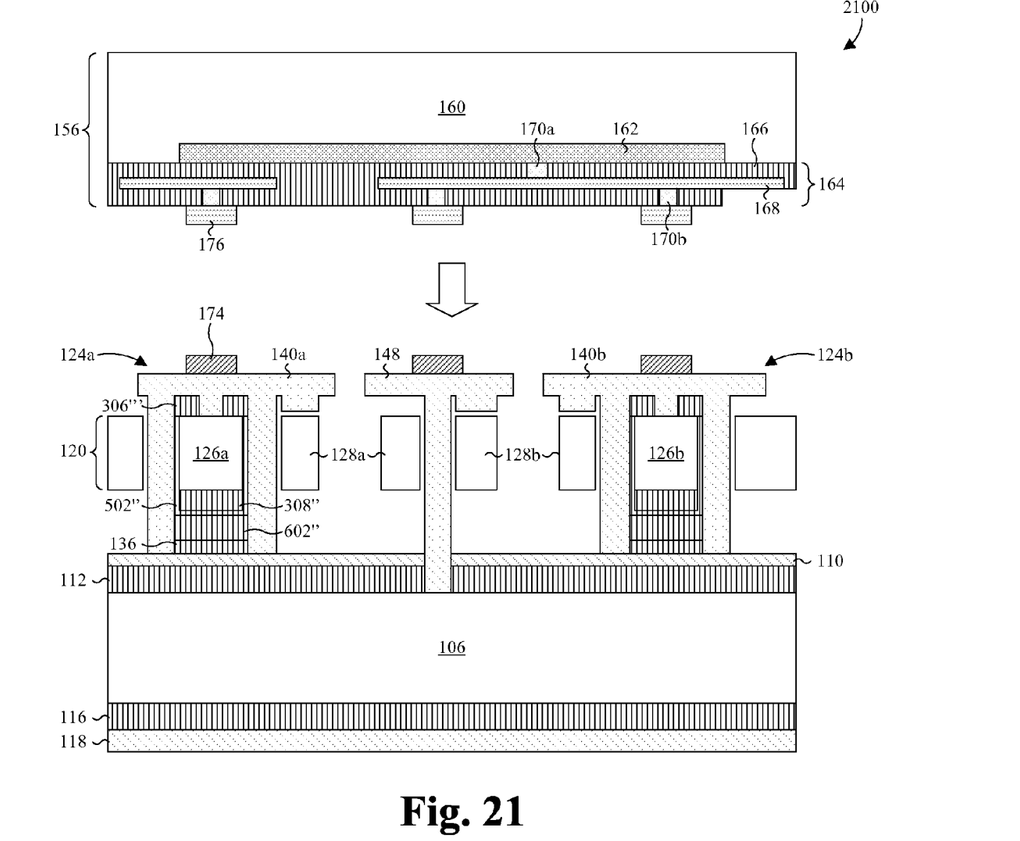

FIGS. 20 and 21 illustrate cross-sectional views 2000, 2100 of some embodiments corresponding to Action 210.

As shown by FIG. 20, a cap wafer 156 is provided. In some embodiments, the cap wafer 156 is a CMOS wafer. The CMOS wafer 156 includes a CMOS substrate region 160 and CMOS devices 162 formed at a bottom surface of the CMOS substrate region 160. The CMOS wafer 156 further includes an interconnect structure 164 arranged over the bottom surface of the CMOS substrate region 160. The interconnect structure 164 includes an interconnect dielectric layer 166 surrounding conductive lines 168 and vias 170a, 170b For readability, only some of the conductive lines 168 and the vias 170 are specifically labeled.

Also shown by FIG. 20, a second cap bonding layer 176 formed over a bottom surface of the cap wafer 156. The second cap bonding layer 176 is patterned with a pattern substantially matching a pattern of the first cap bonding layer 174. The second cap bonding layer 176 is, for example, germanium.

As shown by FIG. 21, the cap wafer 156 is secured over the MEMS device structures 124 to the MEMS wafer 104 by a eutectic bond between the first cap bonding layer 174 and the second cap bonding layer 176. This seals and protects the MEMS device structures 124 from damage and creates chambers over the MEMS device structures 124.

Thus, as can be appreciated from above, the present disclosure provides a semiconductor structure for a MEMS device. A first substrate region of the semiconductor structure includes an electrical isolation layer arranged over a top surface of the first substrate region. A second substrate region of the semiconductor structure is arranged over the electrical isolation layer and includes a MEMS device structure arranged within the second substrate region. The MEMS device structure includes a fixed mass and a proof mass. A dielectric region of the semiconductor structure is arranged over the electrical isolation layer around the fixed mass. A fixed mass electrode of the semiconductor structure is arranged around the dielectric region, and extends through the second substrate region to the electrical isolation layer. An isolated electrode of the semiconductor structure extends through the second substrate region and the electrical isolation layer to the first substrate region on an opposite side of the proof mass as the fixed mass electrode.

In other embodiments, the present disclosure provides a method for manufacturing a semiconductor structure for a MEMS device. A first substrate region and a second substrate region secured over the first substrate region are provided. The first substrate region includes an electrical isolation layer arranged over the first substrate region and a first sacrificial layer arranged over the electrical isolation layer. The second substrate region includes a MEMS device structure arranged within the second substrate region and a second sacrificial layer surrounding the MEMS device structure. The MEMS device structure includes a fixed mass and a proof mass. A fixed mass electrode around a fixed mass region of the first and second sacrificial layers surrounding the fixed mass, and extending through the second substrate region to the electrical isolation layer, is formed. An isolated electrode extending through the second substrate region and the electrical isolation layer to the first substrate region on an opposite side of the proof mass as the fixed mass electrode is formed. Regions of the first and second sacrificial layers surrounding the proof mass are removed while using the fixed mass electrode as an etch stop for the fixed mass regions.

In yet other embodiments, the present disclosure provides a semiconductor structure for first and second MEMS devices. A first substrate region of the semiconductor structure includes an electrical isolation layer arranged over a top surface of the first substrate region. A second substrate region of the semiconductor structure is arranged over the electrical isolation layer and includes first and second MEMS device structures arranged within the second substrate region. The first and second MEMS device structures each include a fixed mass and a proof mass. First and second dielectric regions of the semiconductor structure are arranged over the electrical isolation layer and correspond to the first and second MEMS device structures. The first and second dielectric regions are arranged around the fixed masses of the corresponding MEMS device structures. First and second fixed mass electrodes of the semiconductor structure extend through the second substrate region to the electrical isolation layer and correspond to the first and second dielectric regions. The first and second fixed mass electrodes are arranged around the corresponding dielectric regions. An isolated electrode of the semiconductor structure extends through the second substrate region and the electrical isolation layer to the first substrate region between the first and second fixed mass electrodes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure for a microelectromechanical systems (MEMS) device, the semiconductor structure comprising:
   a first substrate and a second substrate stacked upon one another, wherein the second substrate comprises a fixed mass and a proof mass;
   a fixed mass electrode arranged around the fixed mass, and extending through the second substrate to a point below the fixed mass; and
   an isolated electrode extending through the second substrate, to the first substrate, on an opposite side of the proof mass as the fixed mass electrode.

2. The semiconductor structure according to claim 1, further comprising:
   a dielectric layer arranged between the first and second substrates, around the fixed mass, wherein the fixed mass electrode covers the fixed mass and the dielectric layer, and lines sidewall surfaces of the dielectric layer.

3. The semiconductor structure according to claim 1, wherein the isolated electrode has a T-shaped profile.

4. The semiconductor structure according to claim 1, wherein the second substrate further comprises an anchor, and wherein the semiconductor structure further comprises a spring connecting the proof mass to the anchor.

5. The semiconductor structure according to claim 1, wherein at least one of the isolated electrode and the fixed mass electrode is associated with an in-plane sensing gap laterally arranged between the proof mass and the at least one of the isolated electrode and the fixed mass electrode.

6. The semiconductor structure according to claim 1, wherein one of the isolated electrode and the fixed mass electrode is associated with an out-of-plane sensing gap arranged over the proof mass, between the proof mass and a lateral extension of the one of the isolated electrode and the fixed mass electrode.

7. The semiconductor structure according to claim 1, further comprising:

an electrical isolation layer arranged over the first substrate, between the first substrate and the second substrate;
wherein a lower surface of the fixed mass electrode overlies the electrical isolation layer, and wherein a lower surface of the isolated electrode underlies the electrical isolation layer.

8. The semiconductor structure according to claim 7, further comprising:
a dielectric layer arranged under the electrical isolation layer, between the electrical isolation layer and the first substrate, wherein a lower surface of the isolated electrode is substantially coplanar with a lower surface of the dielectric layer.

9. The semiconductor structure according to claim 1, further comprising:
a cap structure arranged over the second substrate; and
a chamber arranged over the second substrate between the second substrate and the cap structure, wherein the chamber extends laterally from the fixed mass electrode to the isolated electrode.

10. A semiconductor structure for a microelectromechanical systems (MEMS) device, the semiconductor structure comprising:
a first substrate and a second substrate stacked upon one another, wherein the second substrate comprises a proof mass;
an electrical isolation layer arranged over the first substrate, between the first substrate and the second substrate;
a first electrode extending through the second substrate, wherein a lower surface of the first electrode overlies the electrical isolation layer; and
an second electrode arranged on an opposite side of the proof mass as the first electrode, wherein the second electrode extends through the second substrate and comprises a lower surface that underlies the electrical isolation layer.

11. The semiconductor structure according to claim 10, further comprising:
a dielectric layer arranged under the electrical isolation layer, between the electrical isolation layer and the first substrate, wherein the lower surface of the second electrode is substantially coplanar with a lower surface of the dielectric layer.

12. The semiconductor structure according to claim 10, wherein the first electrode encloses a fixed mass of the second substrate.

13. The semiconductor structure according to claim 12, further comprising:
a dielectric layer surrounding the fixed mass between the fixed mass and the first electrode.

14. The semiconductor structure according to claim 10, wherein the second electrode has a T-shaped profile.

15. The semiconductor structure according to claim 10, wherein the second substrate further comprises an anchor, and wherein the semiconductor structure further comprises a spring connecting the proof mass to the anchor.

16. The semiconductor structure according to claim 10, wherein at least one of the second electrode and the first electrode is associated with an in-plane sensing gap laterally arranged between the proof mass and the at least one of the second electrode and the first electrode.

17. The semiconductor structure according to claim 10, wherein one of the second electrode and the first electrode is associated with an out-of-plane sensing gap arranged over the proof mass, between the proof mass and a lateral extension of the one of the second electrode and the first electrode.

18. The semiconductor structure according to claim 10, further comprising:
a cap structure arranged over the second substrate; and
a chamber arranged over the second substrate between the second substrate and the cap structure, wherein the chamber extends laterally from the first electrode to the second electrode.

19. A method for manufacturing a semiconductor structure for a microelectromechanical systems (MEMS) device, the method comprising:
providing a first substrate and a second substrate secured over the first substrate, wherein a first sacrificial layer is arranged between the first and second substrates, wherein the second substrate comprises a fixed mass and a proof mass, and wherein a second sacrificial layer surrounds the fixed mass and the proof mass;
forming a fixed mass electrode extending through the second substrate, and laterally surrounding fixed mass regions of the first and second sacrificial layers that surround the fixed mass;
forming an isolated electrode extending through the second substrate on an opposite side of the proof mass as the fixed mass electrode; and
removing regions of the first and second sacrificial layers surrounding the proof mass while using the fixed mass electrode as an etch stop for the fixed mass regions.

20. The method according to claim 19, wherein an electrical isolation layer is arranged between the first sacrificial layer and the first substrate, and wherein the method further comprises:
forming the fixed mass electrode with a lower surface overlying the electrical isolation layer; and
forming the isolated electrode with a lower surface underlying the electrical isolation layer.

* * * * *